United States Patent
Leisher et al.

(10) Patent No.: US 11,658,460 B2
(45) Date of Patent: May 23, 2023

(54) ENGINEERED CURRENT-DENSITY PROFILE DIODE LASER

(71) Applicant: Lawrence Livermore National Security, LLC, Livermore, CA (US)

(72) Inventors: Paul O. Leisher, Dublin, CA (US); Robert J. Deri, Pleasanton, CA (US); Susant K. Patra, Brentwood, CA (US)

(73) Assignee: LAWRENCE LIVERMORE NATIONAL SECURITY, LLC, Livermore, CA (US)

( * ) Notice: Subject to any disclaimer, the term of this patent is extended or adjusted under 35 U.S.C. 154(b) by 52 days.

(21) Appl. No.: 17/041,256

(22) PCT Filed: Mar. 26, 2019

(86) PCT No.: PCT/US2019/024134
§ 371 (c)(1),
(2) Date: Sep. 24, 2020

(87) PCT Pub. No.: WO2019/191134
PCT Pub. Date: Oct. 3, 2019

(65) Prior Publication Data
US 2021/0057879 A1 Feb. 25, 2021

Related U.S. Application Data

(60) Provisional application No. 62/648,286, filed on Mar. 26, 2018.

(51) Int. Cl.
*H01S 5/042* (2006.01)
*H01S 5/343* (2006.01)

(52) U.S. Cl.
CPC .............. *H01S 5/042* (2013.01); *H01S 5/343* (2013.01)

(58) Field of Classification Search
USPC ........................................... 372/44.01
See application file for complete search history.

(56) References Cited

U.S. PATENT DOCUMENTS

| 9,660,160 B2 * | 5/2017 | Lim ................... H01L 33/62 |
| 2006/0268397 A1 * | 11/2006 | Saini .................. H01S 5/50 359/344 |
| 2009/0268761 A1 | 10/2009 | Rice |
| 2011/0198609 A1 * | 8/2011 | Huang ............. H01L 33/642 257/E33.056 |

(Continued)

FOREIGN PATENT DOCUMENTS

| DE | 10 2008 014092 A1 | 7/2009 |
| JP | S63 96988 A | 4/1988 |

(Continued)

OTHER PUBLICATIONS

PCT International Preliminary Report on Patentability (Chapter I) with Written Opinion from PCT/US2019/024134 dated Sep. 29, 2020.

(Continued)

*Primary Examiner* — Tuan N Nguyen
(74) *Attorney, Agent, or Firm* — Ladas & Parry, LLP

(57) ABSTRACT

The present technology can be used to control the current injection profile in the longitudinal direction of a high-power diode laser in order to optimize current densities as a function of position in the cavity to promote higher reliable output power and increase the electrical to optical conversion efficiency of the device beyond the level which can be achieved without application of this technique. This approach can be utilized, e.g., in the fabrication of semiconductor laser chips to improve the output power and wall plug efficiency for applications requiring improved performance operation.

21 Claims, 3 Drawing Sheets

(56) References Cited

U.S. PATENT DOCUMENTS

2016/0204308 A1 7/2016 Katona et al.
2016/0336484 A1* 11/2016 McGroddy ............. H01L 24/95

FOREIGN PATENT DOCUMENTS

| | | |
|---|---|---|
| JP | H01-266781 A | 10/1989 |
| JP | 2011-508440 A | 3/2011 |
| JP | 4805831 | 11/2011 |
| KR | 10-1015500 B1 | 2/2011 |
| KR | 10-1445451 B1 | 9/2014 |
| WO | 2005-091388 A1 | 9/2005 |

OTHER PUBLICATIONS

Chen et al., "Performance Limitation and Mitigation of Longitudinal Spatial Hole Burning in High-Power Diode Lasers," Proc. of SPIE vol. 8277, 2012, pp. 82771J-1 to 82771J-8.

Hao et al., "Experimental verification of longitudinal spatial hole burning in high-power diode lasers," Proc. of SPIE vol. 9081, 2014, pp. 90810U-1 to 90810U-9.

International Search Report and Written Opinion for PCT/US2019/024134 corresponding to U.S. Appl. No. 17/041,256, 10 pages.

Rinner et al., "Longitudinal carrier density measurement of high power broad area laser diodes," Applied Physics Letters, vol. 80, No. 1, 2002. pp. 19-21.

Walpole et al., "Gaussian Patterned Contacts for Improved Stability of 1.55-µm Tapered Lasers," IEEE Photonics Technology Letters, vol. 12, No. 3, 2000, pp. 257-259.

Wenzel et al., "Theoretical and experimental investigations of the limits to the maximum output power of laser diodes," New Journal of Physics, 12, 2010, 085007, pp. 1-11.

Extended search report from European Patent Application No. 19775222.3 dated Dec. 6, 2021.

Office action from Japanese Patent Application No. 2020-5500106 dated Jan. 10, 2023, with its machine English translation from Global Dossier.

* cited by examiner

ENGINEERED CURRENT-DENSITY PROFILE DIODE LASER

CROSS-REFERENCE TO RELATED APPLICATIONS

This application is a U.S. National Stage of Patent Cooperation Treaty (PCT) Patent Application Serial Number PCT/US2019/024134, which PCT Application claims the priority/benefit of U.S. Provisional Patent Application Ser. No. 62/648,286 filed 26 Mar. 2018. As such, this application claims the benefit of U.S. Provisional Patent Application Ser. No. 62/648,286 filed 26 Mar. 2018.

This application claims the benefit of U.S. Provisional Patent Application No. 62/648,286 titled "High Power Diode Laser with Engineered Current Density Profile" filed Mar. 26, 2018, incorporated herein by reference.

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC, for the operation of Lawrence Livermore National Laboratory.

BACKGROUND

Field

The present technology relates to semiconductor lasers, and more specifically, it relates to scaling of power and brightness produced by high power semiconductor lasers while maintaining high efficiency operation.

Description of Related Art

Significant gains in diode laser brightness over the past decade have been made through lengthening of the laser resonator cavity (i.e., making the chip longer). Once diode lasers reached about 5 mm in cavity length, further attempts to scale brightness and power through cavity length scaling stalled due to a reduction in the power conversion efficiency incurred by going even longer. It is desirable to be able to continue scaling the diode laser length if the cause of the efficiency penalty could be identified and overcome.

Broad area uniform contacts which run along the length of the diode have been used to provide current to the quantum well. It is known that longer cavity length diode lasers suffer from a large asymmetry in the photon density, carrier density, gain and recombination lifetime along the length of the cavity. It is believed that these conditions cause the current density profile (despite having uniform contact) along the length of the cavity to also suffer from non-uniformity. In other words, it is likely that certain areas of the chip draw more current than other areas of the chip, and it is unlikely that the areas which draw the most current are the most optimal position for that current to go. It is desirable to engineer the current density along the length of the diode to overcome the penalty associated with this non-uniformity to enable diode lasers which either operate with greater power conversion efficiency or which operate with equivalent power conversion efficiency with greater output power.

SUMMARY

Several techniques for controlling the longitudinal current density profile in a high-power diode laser are described. For example, patterning of the epi-side dielectric with apertures or producing apertures through proton implantation allows control of the current density profile at the quantum wells through the adjustment of the spacing between these features due to lateral current spreading—the further apart the spacers, the lower the current density at the aperture. In one dimension, if we define the current aperture width as A and the space between the edges of two adjacent apertures as B, keeping other conditions the same, the average current density at the quantum well will increase if A is made larger or B is made smaller (and vice versa). B can be kept smaller than the lateral diffusion length of current so that the spreading (averaging) will actually occur. The size of the aperture (and spacing) in the orthogonal direction will indeed have an effect as well, because current spreading is in 2D. In other words, the present technology contemplates creating apertures of varying width or spacing along the longitudinal direction.

The present technology can be used to control the current injection profile in the longitudinal direction of a high-power diode laser in order to optimize current densities as a function of position in the cavity to promote higher reliable output power and increase the electrical to optical conversion efficiency of the device beyond the level which can be achieved without application of this technique. This approach can be utilized, e.g., in the fabrication of semiconductor laser chips to improve the output power and wall plug efficiency for applications requiring improved performance operation.

BRIEF DESCRIPTION OF THE DRAWINGS

The accompanying drawings, which are incorporated into and form a part of the disclosure, illustrate embodiments of the technology and, together with the description, serve to explain the principles of the technology.

DETAILED DESCRIPTION OF THE TECHNOLOGY

This technology enables diode lasers which either operate with greater power conversion efficiency or which operate with equivalent power conversion efficiency with greater output power. This is achieved through careful control of the current density profile in the longitudinal direction of the device in order to overcome local current crowding and longitudinal spatial hole burning effects which limit the efficiency and power of long-cavity high power diode lasers.

Three techniques for controlling the longitudinal current density at the quantum wells along the length of the diode are described. The first is based on high power broad area diode lasers which use a plurality of apertures (also referred to herein as a plurality of vias) through a dielectric to define the emitting area. The second is based on similar devices which instead create the current aperture through proton implantation in the region of semiconductor which is to be rendered non-conductive. In both cases, the area defined by the aperture controls the location of current injection. By creating a pattern of small (~100 nm to ~10 μm diameter) vias, the current injection area becomes pixelated (in either 1 or 2 dimensions). Lateral spreading of the current injected in these areas as it flows down to the quantum wells leads to a reduction of the average current density at the position of the quantum wells. By adjusting the size and spacing of these small apertures in the dielectric or implant region, the injection current profile can be engineered along the length of the diode. The third technique provides a diode laser that has been formed utilizing a patterned-contact layer approach. Exemplary semiconductor materials herein include Si, Ge, GaAs, GaP, InAs, InP, AlAs, GaN and GaSb, as well as ternary, quaternary and quintenary compound semiconductors based on combinations of these material systems.

The injection current profile is engineered in a way to promote higher current density flow to regions of the laser which operate at higher efficiency and/or to overcome the effects of longitudinal current crowding in very long cavity diode lasers. The technique can be applied to edge-emitting semiconductor lasers of various designs, including GaAs-based devices operating in the 6xx-12xx nm wavelength band, InP-based devices operating in the 13xx-21xx nm band, and GaN-based devices operating in the 3xx-5xx nm band.

Figure 1A:
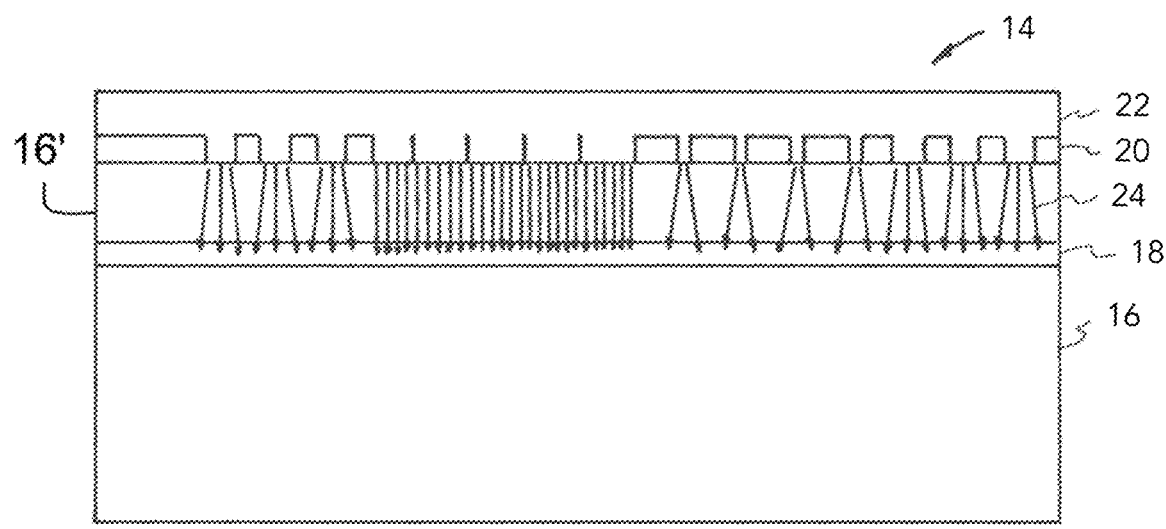
FIG. 1A shows a cross-sectional side view of an embodiment of a diode laser that has been formed utilizing the dielectric-confined approach of the present technology.
Figure 1B:
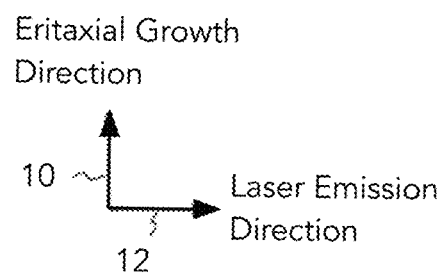
FIG. 1B shows the epitaxial growth direction and the laser emission direction of the laser diode of FIG. 1A.
Figure 1C:
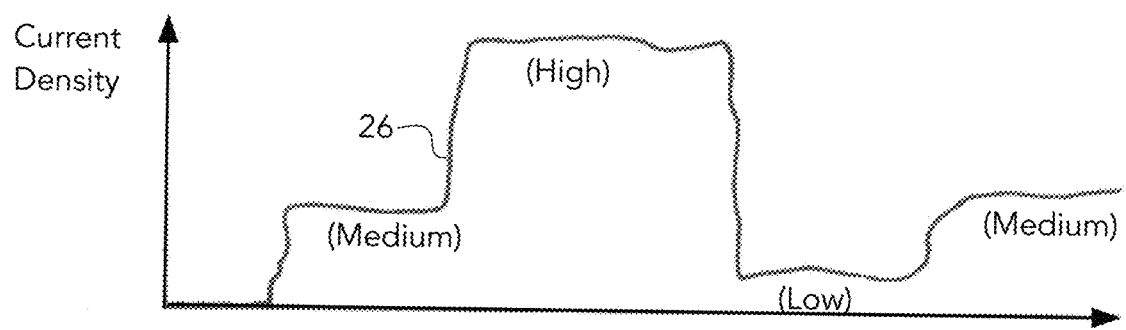
FIG. 1C illustrates how current density varies along the longitudinal position of the laser diode of FIG. 1A according to the pattern of vias in the dielectric insulator.

FIG. 1A shows a cross-sectional side view of an embodiment of an engineered current-density profile diode laser that has been formed utilizing the dielectric-confined approach of the present technology. FIG. 1B shows the epitaxial growth direction 10 and the laser emission direction 12, which is the longitudinal direction of the laser diode 14. The laser diode 14 includes a first portion of semiconductor material 16, an active region 18, a second portion of semiconductor material 16', a patterned dielectric insulator 20 and a metal contact 22. The lines 24 represent current that would flow between the metal contact 22 and the active region 18 if a current source is appropriately applied. FIG. 1C illustrates how current density 26 varies along the longitudinal position of laser diode 14 according to the pattern of vias in the dielectric insulator 20. Example semiconductor materials for 16 and 16' can be selected from the group consisting of Si, Ge, GaAs, GaP, InAs, InP, AlAs, GaN and GaSb, as well as ternary, quaternary and quintenary compound semiconductors based on combinations of materials from the group.

An example fabrication process for the dielectric-confined approach of FIG. 1A is as follows:

1. Blanket deposit (sputter or PECVD) a thin (500 Å to 5000 Å) dielectric layer (SiNx, SiO2) over the top (epi-side, typically p-doped side) of the wafer.

2. Spin, pattern and develop a photoresist pattern using standard processes. The pattern will define the vias for the subsequent etching step. The dielectric layer between vias will be wide where the current density needs to be low and will be narrow where the current density needs to be high. The further apart that the current apertures are, or the smaller that the current apertures are, the less the average current density will be at the active region.

3. Transfer the photoresist pattern into the insulator layer through wet or dry etching of the insulator layer. Remove the photoresist afterwards.

4. Blanket metal deposit the appropriate ohmic contact.

5. Follow with subsequent standard processing steps (anneals, thinning, backside metal deposition, bar cleave, coat, etc.).

Figure 2A:
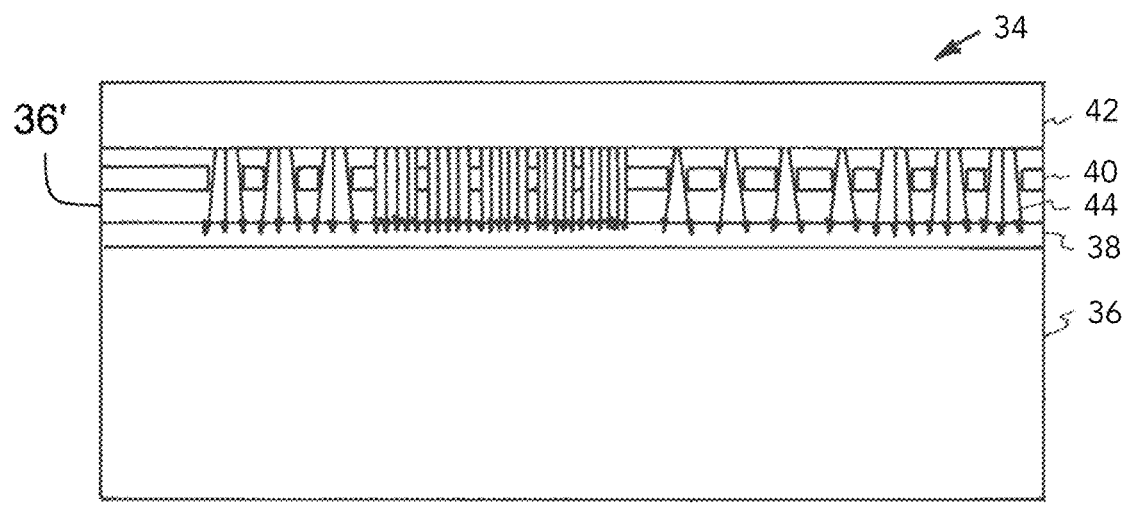
FIG. 2A shows a cross-sectional side view of an embodiment of a diode laser that has been formed utilizing the implant-confined approach of the present technology.
Figure 2B:
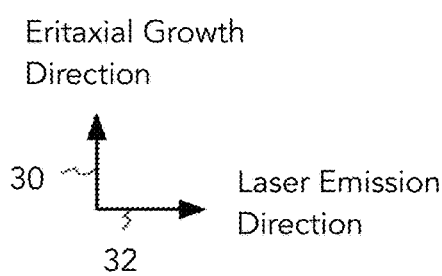
FIG. 2B shows the epitaxial growth direction and the laser emission direction of the laser diode of FIG. 2A
Figure 2C:
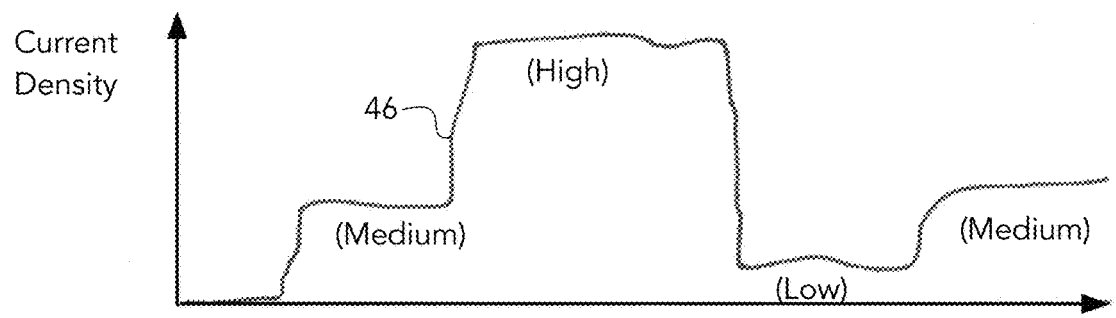
FIG. 2C illustrates how current density varies along the longitudinal position of the laser diode of FIG. 2A according to the pattern of vias formed by the proton implant area.

FIG. 2A shows a cross-sectional side view of an embodiment of an engineered current-density profile diode laser that has been formed utilizing the implant-confined approach of the present technology. FIG. 2B shows the epitaxial growth direction 30 and the laser emission direction 32, which is the longitudinal direction of the laser diode 34. The laser diode 34 includes a first portion of semiconductor material 36, an active region 38, a second portion of semiconductor material 36', a patterned proton implant area 40 (within said second portion of semiconductor material 36') and a metal contact 42. The lines 44 represent current that would flow between the metal contact 42 and the active region 38 if a current source is appropriately applied. FIG. 2C illustrates how current density 46 varies along the longitudinal position of laser diode 34 according to the pattern of vias formed by the proton implant area 40. Example semiconductor materials for 36 and 36' can be selected from the group consisting of Si, Ge, GaAs, GaP, InAs, InP, AlAs, GaN and GaSb, as well as ternary, quaternary and quintenary compound semiconductors based on combinations of materials from the group.

Lateral current spreading in the layers between the contact and quantum well active region will cause the average linear current density at the active region to be related to the fill factor (% via openings in the dielectric) at the contact layer. The spacing between apertures needs to be kept smaller than the average lateral current diffusion length (~1 to 10 μm) between the contact layer and the quantum well so that the current density profile is smooth at the quantum well.

An example fabrication process for the implant-confined approach of FIG. 2A is as follows:

1. Perform blanket metal deposition of the appropriate ohmic contact.

2. Spin, pattern and develop a photoresist pattern using standard processes. This photoresist is typically quite thick (several microns) and serves to define the proton implant apertures.

3. Perform proton implantation at an appropriate dose and energy to render the epitaxial material which lies in the exposed areas non-conductive.

4. Strip the photoresist.

5. Follow subsequent standard processing steps (anneals, thinning, backside metal deposition, bar cleave, coat, etc.).

In some cases, the photoresist and implantation will happen before the blanket metal deposition. This will allow a short wet or dry etch to be performed to remove the highly doped cap layer in order to reduce the lateral diffusion length.

Figure 3A:
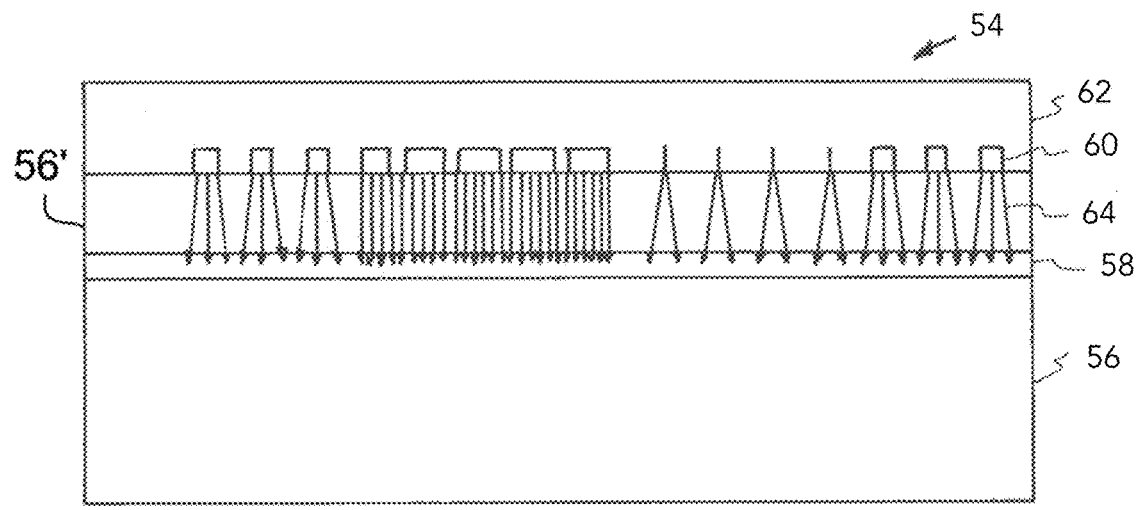
FIG. 3A shows a cross-sectional side view of an embodiment of a diode laser that has been formed utilizing the patterned-contact layer approach of the present technology.

FIG. 3A shows a cross-sectional side view of an embodiment of an engineered current-density profile diode laser that has been formed utilizing a patterned-contact layer approach of the present technology. This approach is conceptually similar to the patterned dielectric contact approach. The top epitaxial layer of a diode layer is typically doped p-type to levels in excess of 1E18/cm$^3$. This very high doping level is needed to form a good ohmic contact when p-metal (typically Ti—Pt—Au) is deposited to the doped GaAs (diodes operating in the 6xx-11xx range and grown on GaAs) or InGaAs (diodes operating in the 12xx-21xx nm range and grown on InP). This high-level doping however does not extend very far into the diode epitaxial structure, and as such the "cap" layer is typically limited to between 50 and 5000 nm in thickness. While the dielectric contact approach relies on injecting current through vias opened up in an insulating layer placed on top of the cap layer, this method simply removes the cap layer in the regions where reduced current density is required. This works because the removal of the highly doped ohmic contact layer causes an increase in the contact resistance at the metal-semiconductor interface, thereby inhibiting high current flow.

Figure 3B:
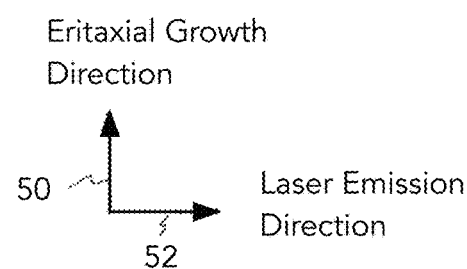
FIG. 3B shows the epitaxial growth direction and the laser emission direction of the laser diode of FIG. 3A.
Figure 3C:
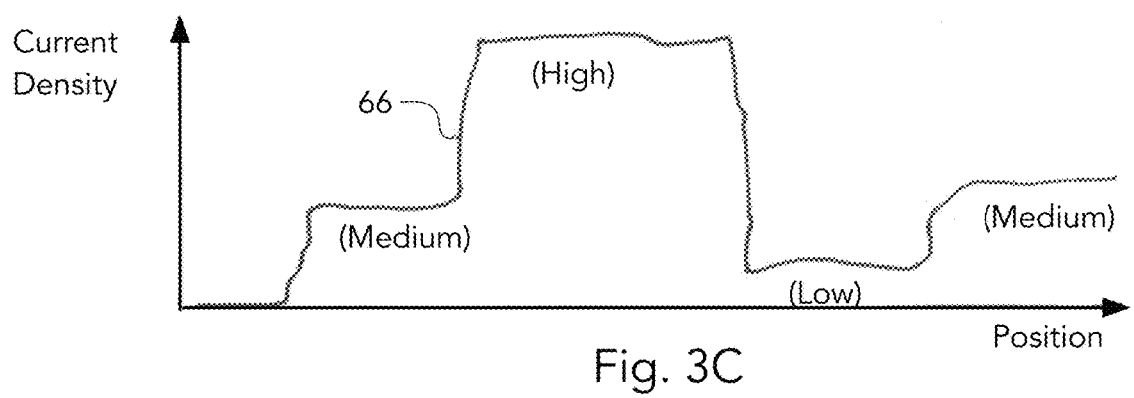
FIG. 3C illustrates how current density varies along the longitudinal position of the laser diode of FIG. 3A according to the pattern of dielectric insulator.

FIG. 3B shows the epitaxial growth direction 50 and the laser emission direction 52, which is the longitudinal direction of the laser diode 54. The laser diode 54 includes a first portion of semiconductor material 56, an active region 58, a second portion of semiconductor material 56', a patterned highly doped cap layer 60 and a metal contact 62. The lines 64 represent current that would flow between the metal contact 62 and the active region 58 if a current source is appropriately applied. FIG. 3C illustrates how current density 66 varies along the longitudinal position of laser diode 54 according to the pattern of dielectric insulator 60. Example semiconductor materials for 56 and 56' can be selected from the group consisting of Si, Ge, GaAs, GaP, InAs, InP, AlAs, GaN and GaSb, as well as ternary, quaternary and quintenary compound semiconductors based on combinations of materials from the group.

An example fabrication process for the dielectric-confined approach of FIG. 3A is as follows:

1. Spin, pattern and develop a photoresist pattern using standard processes. The pattern will define the regions of the highly doped cap layers which will be removed. Removal of the cap layer in these regions will reduce the current density there due to an increased contact resistance in that location. The pattern may be first transferred into a dielectric "hard mask" layer and then etched, or the photoresist layer itself may serve as the etch mask.

2. Etch the highly doped cap layer in the region where the pattern is exposed. This etch may be performed by standard wet or dry-etching techniques. After etching, remove the mask leaving behind a textured surface comprising regions of highly doped semiconductor cap layers and somewhat lower doped semiconductor elsewhere.

3. Blanket metal deposit the appropriate ohmic contact.

4. Follow subsequent standard processing steps (anneals, thinning, backside metal deposition, bar cleave, coat, etc.).

Broadly, this writing discloses at least the following.

The present technology can be used to control the current injection profile in the longitudinal direction of a high-power diode laser in order to optimize current densities as a function of position in the cavity to promote higher reliable output power and increase the electrical to optical conversion efficiency of the device beyond the level which can be achieved without application of this technique. This approach can be utilized, e.g., in the fabrication of semiconductor laser chips to improve the output power and wall plug efficiency for applications requiring improved performance operation.

This writing also presents at least the following Concepts.
Concepts:

1. A engineered current-density profile diode laser, comprising:
   a first portion of substrate material;
   a quantum well active region on said first portion of semiconductor material;
   a second portion of said substrate material on said active region;
   a metal contact on said second portion of said semiconductor material; and
   a plurality of current vias located between said quantum well active region and said metal contact.

2. The diode laser of concepts 1, 7-11 and 13, further comprising dielectric insulator material between said second portion of said semiconductor material and said metal contact, wherein said vias are formed through said dielectric insulator material 3. The diode laser of concepts 1, 7-11 and 13, further comprising a proton implant region within said second portion of semiconductor material, wherein said plurality of vias are formed in said proton implant region.

4. The diode laser of concepts 1, 7-11 and 13, further comprising a patterned capping layer on said second portion of semiconductor material, wherein said plurality of vias are formed in said patterned capping layer, wherein said metal contact is on said second portion of said semiconductor material and on said patterned capping layer.

5. The diode laser of concepts 1, 7-11 and 13, further comprising a plurality of capping layer areas on said second portion of semiconductor material, wherein said plurality of vias are formed in said plurality of capping layer areas, wherein said metal contact is on said second portion of semiconductor material and on said patterned capping layer.

6. The diode laser of concepts 1, 7-11 and 13, further comprising capping layer areas on said second portion of semiconductor material, wherein each area of said capping layer areas is a via of said plurality of vias, wherein said metal contact is on said second portion of semiconductor material and on said capping layer areas.

7. The diode laser of concepts 1-6 and 8-11 and 13, wherein the spacings between said vias are predetermined to provide a desired current density per longitudinal direction of said diode laser.

8. The diode laser of concepts 1-7 and 9-11 and 13, wherein at least one via of said plurality of vias has a diameter within a range from 100 nm to 10 μm.

9. The diode laser of concepts 1-8 and 10, 11 and 13, wherein each via of said plurality of vias has a diameter within a range from 100 nm to 10 μm.

10. The diode laser of concepts 1-9 and 11 and 13, wherein said plurality of vias comprise a pattern that pixelates the current injection area in 1 or 2 dimensions.

11. The diode laser of concepts 1-10 and 13, wherein said laser diode comprises an edge-emitting semiconductor laser.

12. The diode laser of concept 11, wherein said edge-emitting semiconductor laser is selected from the group consisting of a GaAs-based device operating in the 6xx-12xx nm wavelength band, an InP-based device operating in the 13xx-21xx nm band and a GaN-based device operating in the 3xx-5xx nm band.

13. The diode laser of concepts 1-11, wherein said first portion of semiconductor material and said second portion of semiconductor material comprise material selected from the group consisting of Si, Ge, GaAs, GaP, InAs, InP, AlAs, GaN, and GaSb as well as ternary, quaternary, and quintenary compound semiconductors based on combinations of the materials of said group.

14. A method for operating an engineered current-density profile diode laser, comprising providing an engineered current-density profile diode laser, including (i) a first portion of semiconductor material, (ii) a quantum well active region on said first portion of semiconductor material, (iii) a second portion of said semiconductor material on said active region (iv) a metal contact on said second portion of said semiconductor material and (v) a plurality of current vias located between said quantum well active region and said metal contact; and providing a voltage induced current between said metal contact and said active region.

15. The method of concepts 14, 20 and 21, wherein said diode laser further comprises dielectric insulator material between said second portion of said semiconductor material and said metal contact, wherein said vias are formed through said dielectric insulator material.

16. The method of concepts 14, 20 and 21 wherein said diode laser further comprises a proton implant region within said second portion of semiconductor material, wherein said plurality of vias are formed in said proton implant region.

17. The method of concepts 14, 20 and 21, wherein said diode laser further comprises a patterned capping layer on said second portion of semiconductor material, wherein said plurality of vias are formed in said patterned capping layer, wherein said metal contact is on said second portion of said semiconductor material and on said patterned capping layer.

18. The method of concepts 14, 20 and 21 wherein said diode laser further comprises a plurality of capping layer areas on said second portion of semiconductor material, wherein said plurality of vias are formed in said plurality of capping layer areas, wherein said metal contact is on said second portion of semiconductor material and on said patterned capping layer.

19. The method of concepts 14, 20 and 21, wherein said diode laser further comprises capping layer areas on said second portion of semiconductor material, wherein each area of said capping layer areas is a via of said plurality of vias, wherein said metal contact is on said second portion of semiconductor material and on said capping layer areas.

20. The method of concepts 14-19 and 21, wherein the spacings between said vias are predetermined to provide a desired current density per longitudinal direction of said diode laser.

21. The method of concepts 14-20, wherein said first portion of semiconductor material and said second portion of semiconductor material comprise material selected from the group consisting of Si, Ge, GaAs, GaP, InAs, InP, AlAs, GaN, and GaSb as well as ternary, quaternary, and quintenary compound semiconductors based on combinations of the materials of said group.

All elements, parts and steps described herein are preferably included. It is to be understood that any of these elements, parts and steps may be replaced by other elements, parts and steps or deleted altogether as will be obvious to those skilled in the art.

The foregoing description of the technology has been presented for purposes of illustration and description and is not intended to be exhaustive or to limit the technology to the precise form disclosed. Many modifications and variations are possible in light of the above teaching. The embodiments disclosed were meant only to explain the principles of the technology and its practical application to thereby enable others skilled in the art to best use the technology in various embodiments and with various modifications suited to the particular use contemplated. The scope of the technology is to be defined by the following claims.

We claim:

1. A engineered current-density profile diode laser, comprising:
   a first portion of semiconductor material;
   a quantum well active region on said first portion of semiconductor material;
   a second portion of said semiconductor material on said active region;
   a metal contact on said second portion of said semiconductor material; and
   a plurality of current vias located between said quantum well active region and said metal contact.

2. The diode laser of claim 1, further comprising dielectric insulator material between said second portion of said semiconductor material and said metal contact, wherein said vias are formed through said dielectric insulator material.

3. The diode laser of claim 1, further comprising a proton implant region within said second portion of semiconductor material, wherein said plurality of vias are formed in said proton implant region.

4. The diode laser of claim 1, further comprising a patterned capping layer on said second portion of semiconductor material, wherein said plurality of vias are formed in said patterned capping layer, wherein said metal contact is on said second portion of said semiconductor material and on said patterned capping layer.

5. The diode laser of claim 1, further comprising a plurality of capping layer areas on said second portion of semiconductor material, wherein said plurality of vias are formed in said plurality of capping layer areas, wherein said metal contact is on said second portion of semiconductor material and on said patterned capping layer.

6. The diode laser of claim 1, further comprising capping layer areas on said second portion of semiconductor material, wherein each area of said capping layer areas is a via of said plurality of vias, wherein said metal contact is on said second portion of semiconductor material and on said capping layer areas.

7. The diode laser of claim 1, wherein the spacings between said vias are predetermined to provide a desired current density per longitudinal direction of said diode laser.

8. The diode laser of claim 1, wherein at least one via of said plurality of vias has a diameter within a range from 100 nm to 10 μm.

9. The diode laser of claim 1, wherein each via of said plurality of vias has a diameter within a range from 100 nm to 10 μm.

10. The diode laser of claim 1, wherein said plurality of vias comprise a pattern that pixelates the current injection area in 1 or 2 dimensions.

11. The diode laser of claim 1, wherein said laser diode comprises an edge-emitting semiconductor laser.

12. The diode laser of claim 11, wherein said edge-emitting semiconductor laser is selected from the group consisting of a GaAs-based device operating in the 6xx-12xx nm wavelength band, an InP-based device operating in the 13xx-21xx nm band and a GaN-based device operating in the 3xx-5xx nm band.

13. The diode laser of claim 1, wherein said first portion of semiconductor material and said second portion of semiconductor material comprise material selected from the group consisting of Si, Ge, GaAs, GaP, InAs, InP, AlAs, GaN, and GaSb as well as ternary, quaternary, and quintenary compound semiconductors based on combinations of the materials of said group.

14. A method for operating an engineered current-density profile diode laser, comprising:

providing an engineered current-density profile diode laser, including (i) a first portion of semiconductor material, (ii) a quantum well active region on said first portion of semiconductor material, (iii) a second portion of said semiconductor material on said active region (iv) a metal contact on said second portion of said semiconductor material and (v) a plurality of current vias located between said quantum well active region and said metal contact; and providing a voltage induced current between said metal contact and said active region.

15. The method of claim 14, wherein said diode laser further comprises dielectric insulator material between said second portion of said semiconductor material and said metal contact, wherein said vias are formed through said dielectric insulator material.

16. The method of claim 14, wherein said diode laser further comprises a proton implant region within said second portion of semiconductor material, wherein said plurality of vias are formed in said proton implant region.

17. The method of claim 14, wherein said diode laser further comprises a patterned capping layer on said second portion of semiconductor material, wherein said plurality of vias are formed in said patterned capping layer, wherein said metal contact is on said second portion of said semiconductor material and on said patterned capping layer.

18. The method of claim 14, wherein said diode laser further comprises a plurality of capping layer areas on said second portion of semiconductor material, wherein said plurality of vias are formed in said plurality of capping layer areas, wherein said metal contact is on said second portion of semiconductor material and on said patterned capping layer.

19. The method of claim 14, wherein said diode laser further comprises capping layer areas on said second portion of semiconductor material, wherein each area of said capping layer areas is a via of said plurality of vias, wherein said metal contact is on said second portion of semiconductor material and on said capping layer areas.

20. The method of claim 14, wherein the spacings between said vias are predetermined to provide a desired current density per longitudinal direction of said diode laser.

21. The method of claim 14, wherein said first portion of semiconductor material and said second portion of semiconductor material comprise material selected from the group consisting of Si, Ge, GaAs, GaP, InAs, InP, AlAs, GaN, and GaSb as well as ternary, quaternary, and quintenary compound semiconductors based on combinations of the materials of said group.

* * * * *